(12) United States Patent
Ezekwe et al.

(10) Patent No.: US 8,717,015 B2
(45) Date of Patent: May 6, 2014

(54) LINEAR-WITH-MAGNETIC FIELD MAGNETORESISTANCE DEVICE

(75) Inventors: Chinwuba Ezekwe, Albany, CA (US);
Thomas Rocznik, Arnstadt (DE);
Christoph Lang, Cupertino, CA (US);
Sam Kavusi, Menlo Park, CA (US);
Martin Kramer, Grunstadt (DE)

(73) Assignee: Robert Bosch GmbH, Stuttgart (DE)

( * ) Notice: Subject to any disclaimer, the term of this patent is extended or adjusted under 35 U.S.C. 154(b) by 702 days.

(21) Appl. No.: 12/704,775

(22) Filed: Feb. 12, 2010

(65) Prior Publication Data
US 2011/0199078 A1 Aug. 18, 2011

(51) Int. Cl.
*G01R 33/06* (2006.01)
(52) U.S. Cl.
USPC ........... 324/251; 324/244; 324/245; 324/246; 324/247; 324/248; 324/249; 324/250
(58) Field of Classification Search
USPC .......... 324/244–251, 253–258, 301, 324/207.21–207.24, 252; 702/64; 257/421–427
See application file for complete search history.

(56) References Cited

U.S. PATENT DOCUMENTS

| | | | |
|---|---|---|---|
| 6,696,916 B2* | 2/2004 | Sanfilippo et al. | 338/309 |
| 6,984,978 B2* | 1/2006 | Wan et al. | 324/252 |
| 2007/0279053 A1* | 12/2007 | Taylor et al. | 324/252 |
| 2008/0100289 A1* | 5/2008 | Zimmer et al. | 324/252 |
| 2011/0234215 A1* | 9/2011 | Ausserlechner | 324/244 |

OTHER PUBLICATIONS

Popovic, R.S., Hall Effect Devices Second Edition, 2004, pp. 71-76, 86-88, 193-197, 222-224, Institute of Physics Publishing Limited, Philadelphia (27 pages).

* cited by examiner

*Primary Examiner* — Arleen M Vazquez
*Assistant Examiner* — Alesa Allgood
(74) *Attorney, Agent, or Firm* — Maginot, Moore & Beck

(57) ABSTRACT

A magnetic field measuring system is disclosed. The magnetic field measuring system includes a substrate, a conductive well formed in the substrate, the well having a first side with a first length, a first contact electrically coupled to the conductive well at a first location of the first side, a second contact electrically coupled to the conductive well at a second location of the first side, wherein the distance between the first location and the second location is less than the first length, a stimulus circuit coupled to the first contact and the second contact, and a sensor for identifying a property indicative of the length of a current path from the first location to the second location through the conductive well.

16 Claims, 8 Drawing Sheets

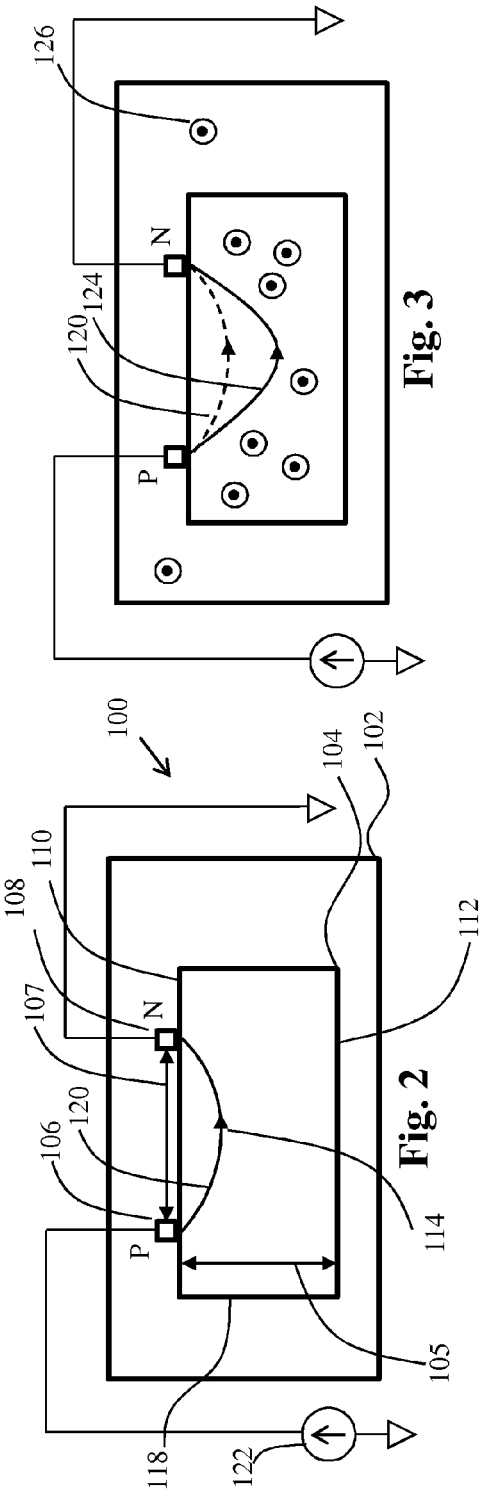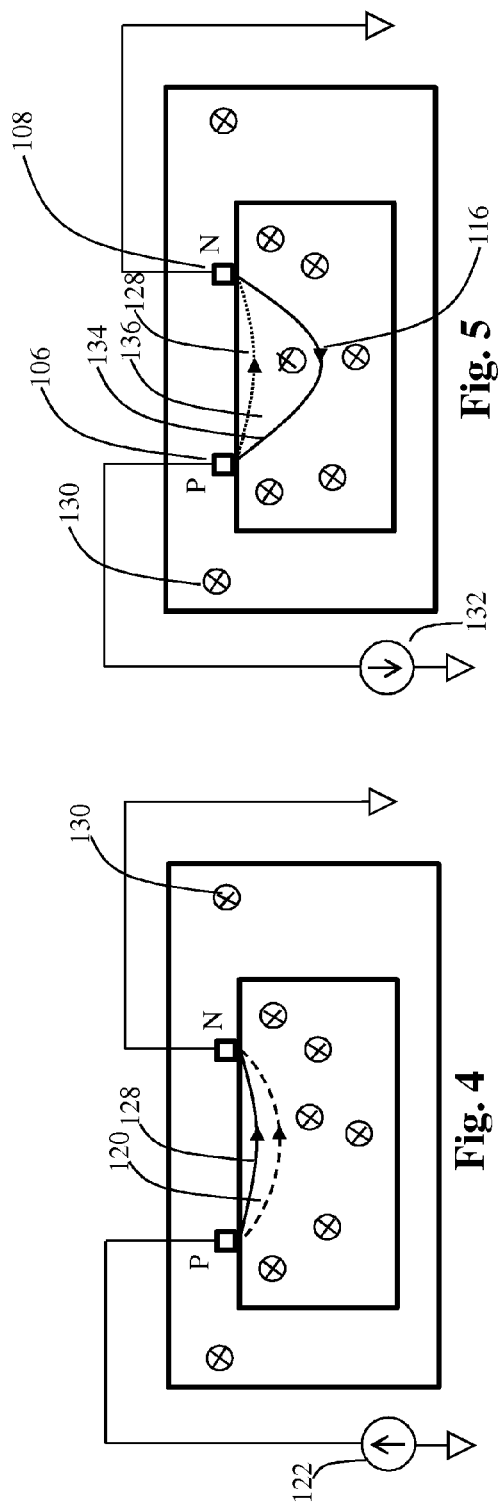

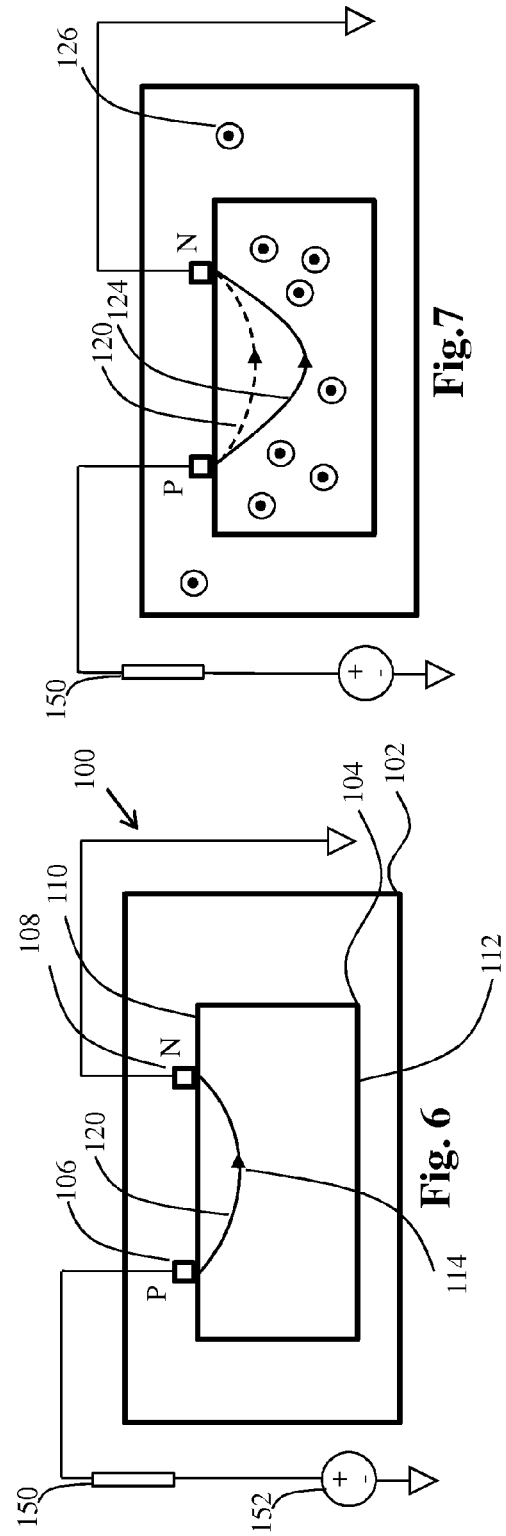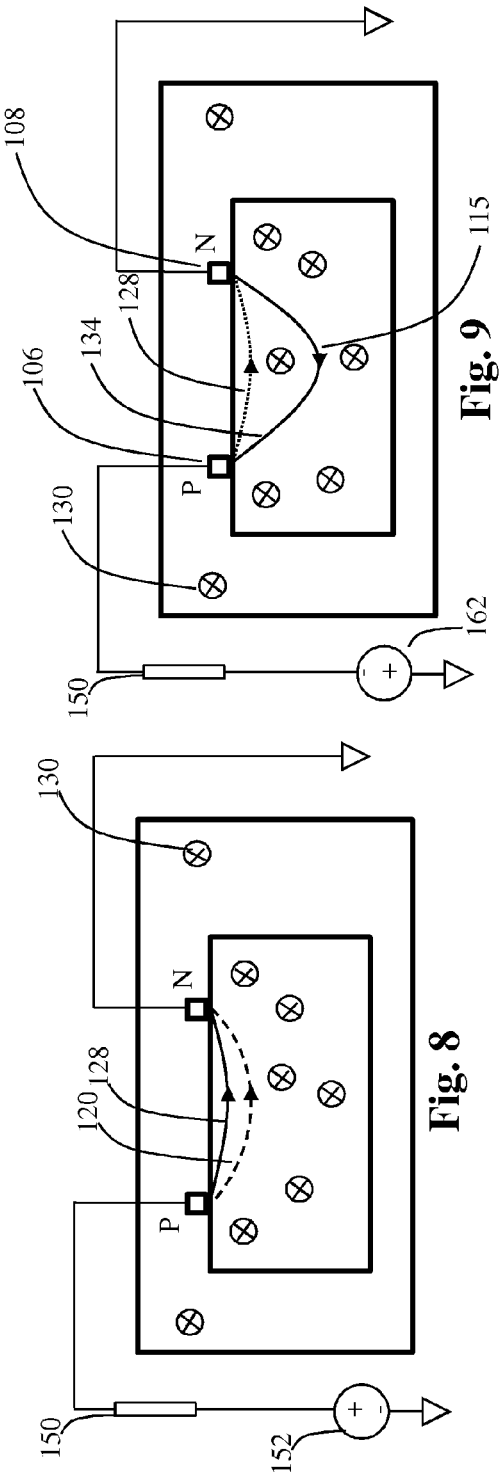

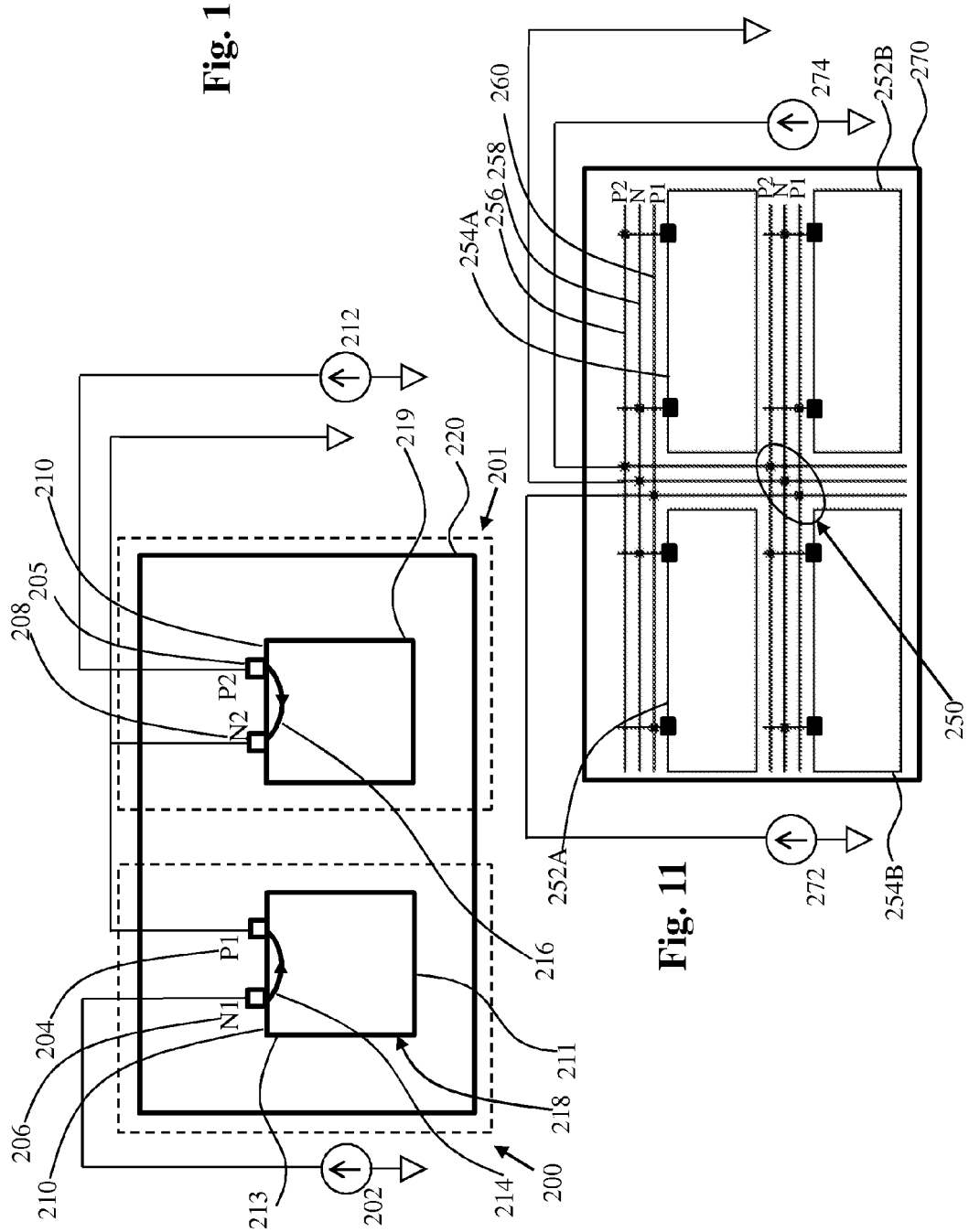

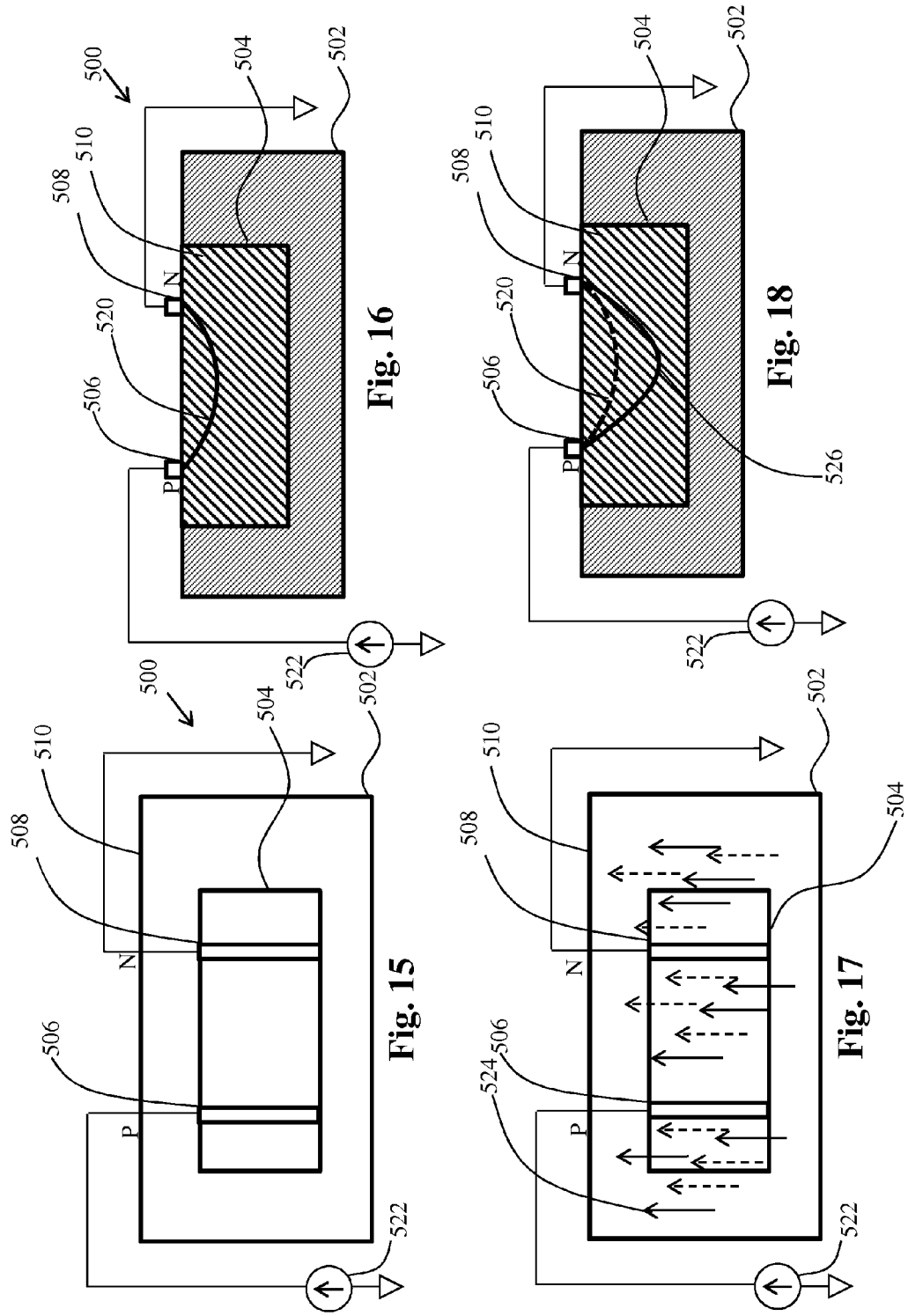

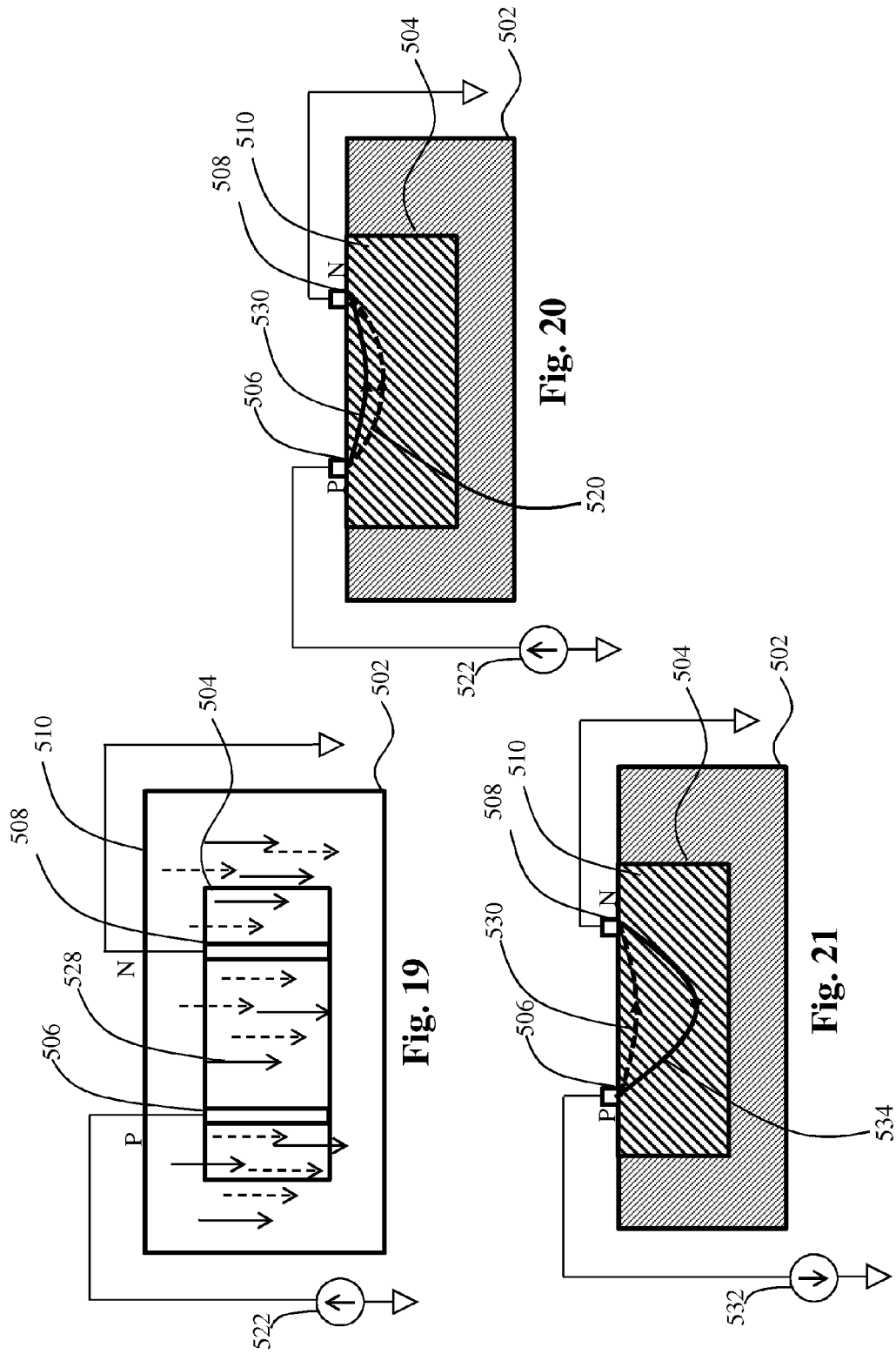

LINEAR-WITH-MAGNETIC FIELD MAGNETORESISTANCE DEVICE

FIELD

The present invention generally relates to devices that are used to measure magnetic field intensity and direction and more particularly to magnetoresistive devices that use changes in resistance to determine the magnetic field intensity and direction.

BACKGROUND

Magnetoresistive devices use change in the electrical resistance of a material between two electrodes in the presence of a magnetic field to determine the strength of the magnetic field. A certain amount of electrical resistance is present in the material without any magnetic field being applied. When a magnetic field is applied the electrical resistance changes.

The change in the electrical resistance corresponds to the strength of the magnetic field. This change in the electrical resistance is the result of the Lorentz force applied to the charge carrying particles. When a charge carrying particle is in the presence of a magnetic field, the Lorentz force applied to the particle is expressed as $$F = q[E + (v \times B)],$$

where F is the Lorentz force in Newtons,
q is the charge of the charge carrying particle in coulombs,
v is the instantaneous velocity in m/s,
E is the electric field in v/m, and
B is the magnetic field in Tesla. The "×" is the vector cross-product between v and B.

To ensure proper sensitivity to the magnetic field, it has been a goal of the magnetoresistive device makers in the prior art to maximize the change in the electrical resistance of the magnetoresistive devices when a magnetic field is applied. For example, in semiconductor magnetoresistive devices the mobility of the semiconductor material affects the velocity of the charge carrying particles and thereby affects the Lorentz force applied to those particles. In order to maximize change in resistance, semiconductor materials with high mobilities are often chosen.

The relationship between the change in the resistance in a magnetoresistive device, the applied magnetic field, and the mobility is non-linear. The change in the resistance is proportional to $(1+(\mu B)^2)$, where $\mu$ is the mobility. This non-linear relationship presents challenges in determining the direction of the magnetic field when a magnetoresistive device is placed in a magnetic field. For example, the same amount of change in the electrical resistance is experienced whether the magnetic field is coming out of a plane or going into the plane, i.e., positive and negative magnetic fields.

Also, sensitivity to changes in the magnetic field is disadvantageously affected by the non-linear relationship described above. Furthermore, when the magnetic field is parallel to the plane of the magnetoresistive device, change in the electrical resistance is not as easily determinable. This difficulty is due to the vector cross-product of the B field and the velocity of the charge carriers, as provided in the Lorentz force equation. When the magnetic field is parallel to the plane of the magnetoresistive device, the cross product becomes zero since the angle between the two vectors is either 0° or 180°.

Therefore, a need exists to address the stated shortcomings of the prior art. Particularly, a need exists to measure the magnetic field as a result of change in the electrical resistance of a magnetoresistive device with improved sensitivity, including situations where a further need exists for determining the direction of the magnetic field.

SUMMARY

In one embodiment, a magnetic field measuring system is disclosed. The magnetic field measuring system includes a substrate, a conductive well formed in the substrate, the well having a first side with a first length, a first contact electrically coupled to the conductive well at a first location of the first side, a second contact electrically coupled to the conductive well at a second location of the first side, wherein the distance between the first location and the second location is less than the first length, a stimulus circuit coupled to the first contact and the second contact, and a sensor for identifying a property indicative of the length of a current path from the first location to the second location through the conductive well.

In another embodiment, a method for measuring a magnetic field is disclosed. The method includes forming a conductive well in a substrate, the well having a first edge with a first length, electrically coupling a first contact to the conductive well at a first location of the first edge, electrically coupling a second contact to the conductive well at a second location of the first edge, wherein the distance between the first location and the second location is less than the first length, identifying a property indicative of the length of a current path from the first location to the second location through the conductive well, and determining the strength of a magnetic field passing through the conductive well based upon the identified property.

The above described features and advantages, as well as others, will become more readily apparent to those of ordinary skill in the art by reference to the following detailed description and accompanying drawings.

BRIEF DESCRIPTION OF THE DRAWINGS

FIGS. 2-5 depict top plan views of magnetoresistive devices for single-ended measurements including current sources and designed to detect perpendicular magnetic field lines;

FIGS. 6-9 depict top plan views of magnetoresistive devices for single-ended measurements including voltage sources and designed to detect perpendicular magnetic field lines;

FIG. 10 depicts a top plan view of side-by-side magnetoresistive devices for obtaining differential measurements including current sources and designed to detect perpendicular magnetic field lines;

FIG. 11 depicts a top plan view of magnetoresistive devices for differential measurements including current sources and matching of the magnetoresistive devices and designed to detect perpendicular magnetic field lines;

FIG. 15 depicts a top plan view of a magnetoresistive device for single-ended measurements including a current source and designed to detect in-plane magnetic field lines;

FIG. 16 depicts a cross sectional view of a magnetoresistive device for single-ended measurements including a current source and designed to detect in-plane magnetic field lines;

FIG. 17 depicts a top plan view of a magnetoresistive device for single-ended measurements including a current source and designed to detect in-plane magnetic field lines;

FIG. 18 depicts a cross sectional view of a magnetoresistive device for single-ended measurements including a current source and designed to detect in-plane magnetic field lines;

FIG. 19 depicts a top plan view of a magnetoresistive device for single-ended measurements including a current source and designed to detect in-plane magnetic field lines with an opposite direction as compared to the in-plane magnetic field lines depicted in FIG. 17;

FIG. 20 depicts a cross sectional view of a magnetoresistive device for single-ended measurements including a current source and designed to detect in-plane magnetic field lines with an opposite direction as compared to the in-plane magnetic field lines depicted in FIG. 17; and FIG. 21 depicts a cross sectional view of a magnetoresistive device for single-ended measurements including a current source and designed to detect in-plane magnetic field lines with the current source in an opposite direction to as compared to the current source of FIG. 20.

DETAILED DESCRIPTION

Figure 1:
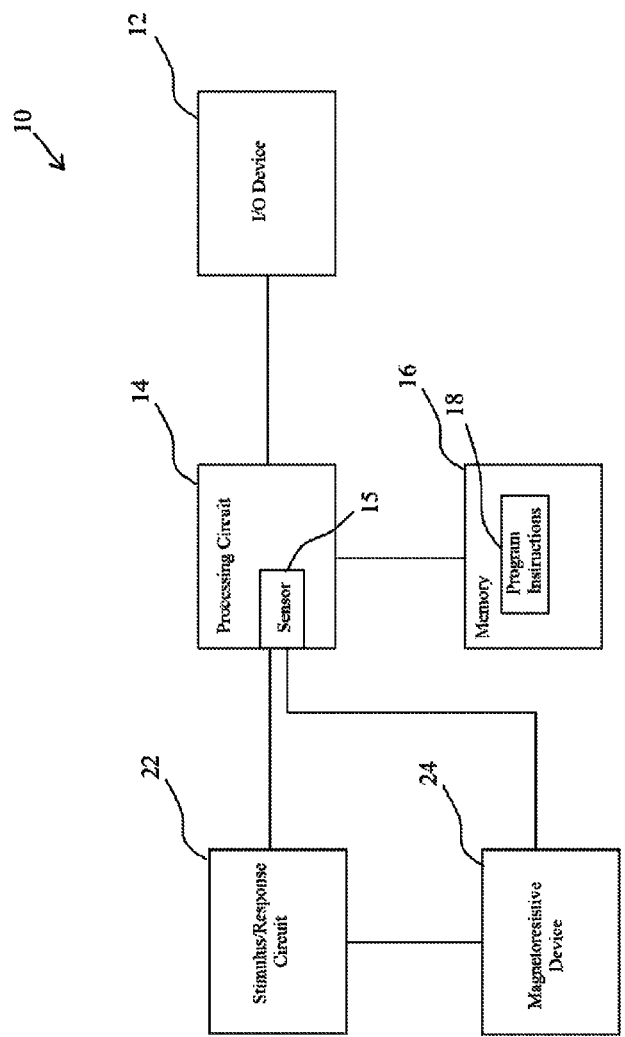
FIG. 1 depicts a block diagram of a system having blocks in communication with a magnetoresistive device.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

Referring to FIG. 1, there is depicted a representation of a magnetoresistive system generally designated 10. The magnetoresistive system 10 includes an I/O device 12, a processing circuit 14 and a memory 16. The I/O device 12 may include a user interface, graphical user interface, keyboards, pointing devices, remote and/or local communication links, displays, and other devices that allow externally generated information to be provided to the magnetoresistive system 10, and that allow internal information of the magnetoresistive system 10 to be communicated externally.

The processing circuit 14 may suitably be a general purpose computer processing circuit such as a microprocessor and its associated circuitry. The processing circuit 14 is operable to carry out the operations attributed to it herein.

Within the memory 16 are various program instructions 18. The program instructions 18 are executable by the processing circuit 104 and/or any other components as appropriate.

The magnetoresistive system 10 further includes a stimulus/response circuit 22 and at least one magnetoresistive device 24 that is stimulated by the stimulus/response circuit 22. In one embodiment, the stimulus/response circuit 22 provides a stimulus to the magnetoresistive device 24 and also provides a response to the processing circuit 14. The processing circuit 14 is connected to the stimulus/response circuit 22 to request stimuli and sense responses from the stimulus/response circuit 22. As depicted in FIG. 1, the processing circuit includes a sensor 15 that is configured to identify a property, such as current level or voltage drop, indicative of a length a current path through the magneto resistive device 24 from the responses of the stimulus/response circuit.

Referring to FIG. 2, a top plan view of an exemplary embodiment of a magnetoresistance device 100 which may be incorporated into the magnetoresistive system 10 is shown. The basic layout of the magnetoresistance device 100 includes a well or diffusion area 104 inside a substrate 102. The substrate 102 can be a positively or a negatively doped substrate. The well 104 can be an N-well, a P-well, an N-diffusion, or a P-diffusion area. The well 104, however, is of an opposite doping type than the substrate 102. Ohmic contacts 106 and 108 are electrically connected to the well 104. A current source 122 is connected to the ohmic contact 106, while the ohmic contact 108 is connected to the electrical ground.

The well 104 is shown as a rectangle which also has a depth extending into the substrate 102. The well 104 can have different shapes provided that ohmic contacts 106 and 108 are placed asymmetrically with respect to the well 104. By way of example, in the exemplary embodiment of FIG. 2, the ohmic contacts 106 and 108 are placed on the top edge 110 of the well 104. The ohmic contacts 106 and 108, however, could have been placed asymmetrically on another edge of the well 104, e.g., bottom edge 112. It is also envisioned that the ohmic contacts 106 and 108 can be placed on different edges. For example, in one embodiment, the ohmic contact 106 can be placed on the left edge 118 while the ohmic contact 108 can be placed on the top edge 110 of the well 104. In one embodiment, the ohmic contacts 106 and 108 are separated by a distance 107 which may be selected to be less than a width 105 of the rectangular well 104, and the size of the ohmic contacts 106 and 108 (e.g., the width of the ohmic contacts 106 and 108 as measured along the edge 110) may be selected to be less than the distance between the ohmic contacts 106 and 108. In one embodiment the ohmic contacts 106 and 108 are point contacts.

Connections between the ohmic contact 106 and a current source 122 and the ohmic contact 108 and an electrical ground initiate current flow along a mean current path 120. The asymmetrical placements of the ohmic contacts 106 and 108 results in a curved mean current path 120 in the absence of a magnetic field. With the configuration shown in FIG. 2, the mean current path 120 is mainly within an area proximate the top edge 110. Direction of the mean current path 120 is shown by way of the arrow 114, i.e., flowing from the ohmic contact 106 to the ohmic contact 108, which is consistent with the direction of the current supplying the current source 122.

The magnetoresistance device 100 shown in FIG. 2 is suitable for magnetic fields that are perpendicular to the plane in which the well 104 extends, i.e., fields that cross the well 104. These perpendicular fields can be crossing out of the plane of the well 104 (coming out of the plane) or into the plane (going into the plane). By way of example, the magnetoresistance device 100 is depicted in FIG. 3 with an out-of-plane magnetic field. The symbolic circles with dots at the centers of the circles, identified by reference numeral 126, indicate a magnetic field that is perpendicular to the plane of the well 104 and is coming out of the plane. For reference purposes, the mean current path 120, the mean current path with a zero magnetic field, is shown in dashed lines. In the presence of the out-of-plane magnetic field 126, the Lorentz force causes a new curved mean current path 124 to be established between the ohmic contacts 106 and 108. The new mean current path 124, however, extends farther away from the top edge 110 than the mean current path 120. Thus the path length of the mean current path 124 is longer than the path length of the mean current path 120.

The increased length of the mean current path of 124 as compared to the mean current path 120 can be used to determine the strength of the magnetic field 126. Generally, the mean current path 124 provides a higher resistance because of the longer distance required for the charge carriers to travel through the well 104. The higher resistance results in a larger voltage drop across the ohmic contacts 106 and 108.

By way of another example, the magnetoresistance device 100 is depicted in FIG. 4 with an "into-plane" magnetic field 130 as represented by the symbolic circles with crosses at the centers of the circles. The magnetic field 130 is perpendicular to the plane of the well 104 and is going into the plane as viewed in FIG. 4. For reference purposes, the mean current path 120, the mean current path with a zero magnetic field, is shown in dashed lines. In the presence of the into-plane magnetic field 130, the Lorentz force causes a new mean curved current path 128 to be established between the ohmic contacts 106 and 108. The new mean current path 128 is closer to the top edge 110 than the mean current path 120. Thus the path length of the mean current path 128 is shorter than the path length of the mean current path 120. The decreased length of the current path of the new mean current path 128 as compared to the mean current path 120 can be used to determine the strength of the magnetic field. Therefore, an opposite direction of the magnetic field that is perpendicular to the plane of the well 104, shown in FIGS. 3 and 4, causes the current paths to elongate in one case and to shorten in the other case.

While the direction of the magnetic field, i.e., coming out of the plane or going into the plan of the well 104, can result in lengthening or shortening of the mean current path 120, reversing the direction of the current source can also result in lengthening or shortening of the mean current path 120. By way of example, the magnetoresistance device 100 is depicted in FIG. 5 with an into-plane magnetic field 130 and with a current source 132 that provides a current that follows in a reversed direction as compared to the current source 122 shown in FIG. 4. The reversed current source 132 generates a mean current path 134 that is substantially equivalent in length to the mean current path 124 of FIG. 3. That is, reversing the direction of the current source and reversing the direction of perpendicular magnetic field lines have substantially the same effect on the current paths.

The current reversal is also evidenced in the direction 116 of current flowing along the mean current path 134 between the ohmic contacts 108 and 106. Referring to FIG. 5, the dotted mean current path 128 indicates the mean current path of FIG. 4. The solid mean current path 134 indicates the mean current path with the current source 132 in presence of a magnetic field 130 that is perpendicular to the plane of the well 104 and is going into the plane. The voltage drop across the ohmic contacts 108 and 106, corresponding to the mean current path 134, can be used to compare to the previous measured voltage across the ohmic contacts 106 and 108, i.e., with respect to the mean current path 128 in FIG. 4, to determine the magnetic field intensity. The difference between the two voltage measurements is proportional to the intensity of the magnetic field crossing the well 104. That is, the quantity ($V_{128}-V_{134}$) is proportional to B.

In addition to determining the intensity of the magnetic field, the change in voltage across the ohmic contacts 106 and 108 can be used to ascertain the direction of the magnetic field. Referring to FIGS. 3 and 4, the direction of the magnetic field can be ascertained by determining if the voltage across the ohmic contacts 106 and 108 increases or decreases when a magnetic field is applied. An increase in the voltage drop across the ohmic contact 106 and 108 indicates the magnetic field is coming out of the plane.

FIGS. 6-9 depict single ended measurement techniques involving the magnetoresistive device 100 of FIG. 2 configured with a voltage source 152. FIG. 6 depicts the magnetoresistive device 100. A sense resistor 150 is connected in between the magnetoresistive device 100 and the voltage source 152.

Connections between the ohmic contact 106 and the sense resistor 150 and the ohmic contact 108 and the electrical ground establish the mean current path 120. Asymmetrical placement of the ohmic contacts 106 and 108 results in the curved mean current path 120 in the absence of a magnetic field with the direction of the mean current path indicated by reference numeral 114. The sense resistor 150 is provided to measure current flowing through the magnetoresistive device 100. Measuring the voltage drop across the sense resistor 150 and dividing the voltage drop by the resistance of the sense resistor 150 results in the current flowing through the sense resistor 150, and hence through the magnetoresistive device 100. This method of measuring current is also used in relationship with FIGS. 8 and 9 for determining the magnetic field intensity, as described below.

In FIG. 6, there is no magnetic field applied to the magnetoresistive device 100. The magnetoresistance device 100 is depicted in FIG. 7 with an out-of-plane magnetic field. The symbolic circles with dots at the centers of the circles, identified by reference numeral 126, indicate a magnetic field that is perpendicular to the plane of the well 104 and which is coming out of the plane. For reference purposes, the mean current path 120, the mean current path with a zero magnetic field, is shown in dashed lines. In the presence of the out-of-plane magnetic field 126, the Lorentz force causes a new mean curved current path 124 to be established between the ohmic contacts 106 and 108. The new mean current path, however, extends further away from the top edge 110 than the mean current path 120. Thus the path length of the mean current path 124 is longer than the path length of the mean current path 120. The increased length of the mean current path of 124 as compared to the mean current path 120 can be used to determine the strength of the magnetic field 126.

The magnetoresistance device 100 is depicted in FIG. 8 with the into-plane magnetic field 130. For reference purposes, the mean current path 120, the mean current path with a zero magnetic field, is shown in dashed lines. In the presence of the into-plane magnetic field 130, the Lorentz force causes a new curved mean current path 128 to be established between the ohmic contacts 106 and 108. The new mean current path 128 is closer to the top edge 110 than the mean current path 120. Thus the path length of the mean current path 128 has a shorter path than the path length of the mean current path 120. The decreased length of the mean current path of 128 as compared to the mean current path 120 can be used to determine the strength of the magnetic field. The opposite directions of the magnetic field that is perpendicular to the plane of the well 104, shown in FIGS. 7 and 8, causes current paths to elongate in one case and to shorten in the other case.

While the direction of the magnetic field, i.e., coming out of the plane or going into the well 104, can result in lengthening or shortening of the mean current path 120, reversing the direction of the current can also result in lengthening or shortening of the mean current path 120. By way of example, the magnetoresistance device 100 is depicted in FIG. 9 with an into-plane magnetic field and with a voltage source 162 that has a reversed direction as compared to the voltage source 152 shown in FIG. 8. The reversed voltage source 162 results in a mean current path 134 that is substantially equivalent to the mean current path 124 of FIG. 7, except for the direction of the mean current path as indicated by the reference numeral 115.

The current flowing between the ohmic contacts 108 and 106, for the configuration depicted in FIG. 9, can be used to determine the magnetic field intensity. This current is identified as $I_{134}$. The current $I_{134}$ is compared to the measured current flowing through the ohmic contacts 106 and 108 for the configuration shown in FIG. 8. This current is identified as $I_{128}$. The difference between the two current measurements is proportional to the intensity of the magnetic field crossing the well 104. That is, the quantity $(I_{128}-I_{134})$ is proportional to B.

While the intensity of the magnetic field can be determined by measuring the change in voltage across the ohmic contacts 106 and 108, the direction of the magnetic field can also be ascertained. Referring to FIGS. 7 and 8, the direction of the magnetic field can be ascertained by determining if the voltage across the ohmic contacts 106 and 108 increases or decreases when a magnetic field is applied. An increase in the voltage drop across the ohmic contact 106 and 108 indicates the magnetic field is coming out of the plane.

Although single ended current-based or voltage-based measurements are relatively simple, these techniques suffer from electrical offsets present in the well 104. For example, an offset in the well 104 causing excessive lengthening or shortening of the mean current path can result in inaccurate measurements. Also, the resistances involved in measuring magnetic fields are several orders of magnitude larger than any change in the resistance. Therefore, measuring a first resistance using a first single ended measurement and comparing that measurement to a second measurement using a second single ended measurement in order to determine the change between the first and the second resistances can be difficult. A differential measurement scheme can remedy the above shortcoming of the single ended measurement techniques. Referring to FIG. 10, a top plan view of an exemplary embodiment of a pair of magnetoresistance devices 200 and 201 is depicted with a voltage-based differential measurement scheme. Wells or diffusion areas 218 and 219 are positioned within a substrate 220. The wells 218 and 219 form the pair of magnetoresistance devices 200 and 201, respectively. The extension of the wells 218 and 219 into the substrate 220 can be minimal. Two pairs of ohmic contacts 204, 205, 206, and 208 are used to connect the pair of magnetoresistive devices 200 and 201. The position of these contacts with respect to each well 218 and 219 is asymmetrical. That is, all four contacts are at the top edge 210 of the wells 218 and 219. The ohmic contacts 204, 205, 206, and 208 could have been placed asymmetrically on another edge of the well 218 or 219, e.g., bottom edge 211. It is also envisioned that the ohmic contacts 204, 205, 206, and 208 can be placed on different edges. For example, in one embodiment, the ohmic contact 204 and 206 can be placed on the left edge 213 of the well 218 while the ohmic contacts 205 and 208 can be placed on the top edge 210 of the well 219. The ohmic contacts 206 and 205 are coupled to current sources 202 and 212, respectively. The ohmic contacts 204 and 208 are coupled to electrical ground.

Connections between the ohmic contact 206 and the current source 202, the ohmic contact 205 and the current source 212, and the ohmic contacts 204 and 208 and the electrical ground establish curved mean current paths 214 and 216. The curved mean current paths 214 and 216 shown in FIG. 10 are mainly on the upper portion of the wells 218 and 219 and do not significantly extend into the wells 218 and 219. Due to the connectivity orientation of these ohmic contacts with the current sources 202 and 212 and the electrical ground, the curved mean current paths 214 and 216 have opposite directions as indicated by the arrows. Placing the pair of magnetoresistive device 200 and 201 in a magnetic field with magnetic lines perpendicular to the plane of the wells 218 and 219 results in lengthening or shortening of the mean current paths 214 and 216, depending on the direction of the magnetic field lines. The change in the mean current paths 214 and 216 is such that while one lengthens the other shortens.

To measure the intensity of the magnetic field, a differential voltage $dV_{11-12}$ can be measured with respect to the ohmic contacts 206 and 205. In particular, $V_{11}$ is the voltage drop between the ohmic contacts 206 and 204. $V_{11}$ constitutes the voltage across the first magnetoresistive device 200. Similarly, $V_{12}$ is the voltage drop between the ohmic contact 205 and 208. $V_{12}$ constitutes the voltage across the second magnetoresistive device 201. $dV_{11-12}$ is the difference between $V_{11}$ and $V_{12}$, i.e., $V_{11}-V_{12}$. Once the differential voltage $dV_{11-12}$ is measured, the current sources 202 and 212 are reversed and the differential voltage measurement repeated to produce $dV_{21-22}$, i.e., $V_{21}-V_{22}$. The sum of $dV_{11-12}$ and $dV_{21-22}$ is proportional to the intensity of the magnetic field.

As explained above, the differential measurement scheme presented in FIG. 10 splits the magnetoresistive device into two devices 200 and 201. Offsets present in both of these halves cancel out via the differential measurements. Therefore, while the differential measurement scheme is more complex than the single ended scheme, it improves inaccuracies associated with offsets that can be present in the single ended measurement schemes.

While the differential scheme of FIG. 10 is an improvement over the single ended measurement scheme, further improvement can be achieved by matching the pair of magnetoresistive devices 200 and 201 used in the differential scheme. Referring to FIG. 11, one embodiment of matching a pair of magnetoresistive devices 252 and 254 is shown. Each member of the pair is split into two halves, i.e., 252A, 252B, 254A, and 254B. These sets of halves are oriented about the substrate 270 such that a centroid 250 is formed. A current source 272 is applied to a path 260 which is coupled to the halves 252A and 252B. A current source 274 is applied to a path 256 which is coupled to the halves 254A and 254B. Electrical ground is coupled to a path 258.

The differential measurement is performed as follows. $V_{11}$ represents a voltage on the path 260 with respect to the electrical ground, resulting in current passing through the halves 252A and 252B. $V_{12}$ represents a voltage on the path 256 with respect to the electrical ground, resulting in current passing through the halves 254A and 254B. The first differential voltage, i.e., $dV_{11-12}$ is the difference between $V_{11}$ and $V_{12}$, i.e., $V_{11}-V_{12}$. Once the voltage $dV_{11-12}$ is measured, the bias currents 272 and 274 are reversed and the differential voltage measurement repeated to produce $dV2_{21-22}$, i.e., $V_{21}-V_{22}$. The sum of $dV_{11-12}$ and $dV_{11-12}$ is proportional to the intensity of the magnetic field.

Figure 12:
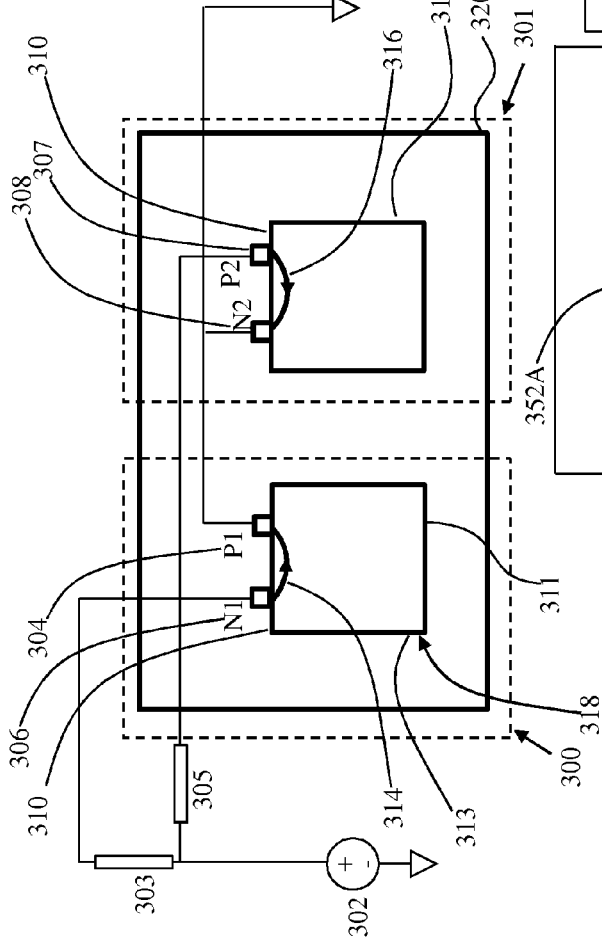
FIG. 12 depicts a top plan view of side-by-side magnetoresistive devices for differential measurements including a voltage source and designed to detect perpendicular magnetic field lines.
Figure 13:
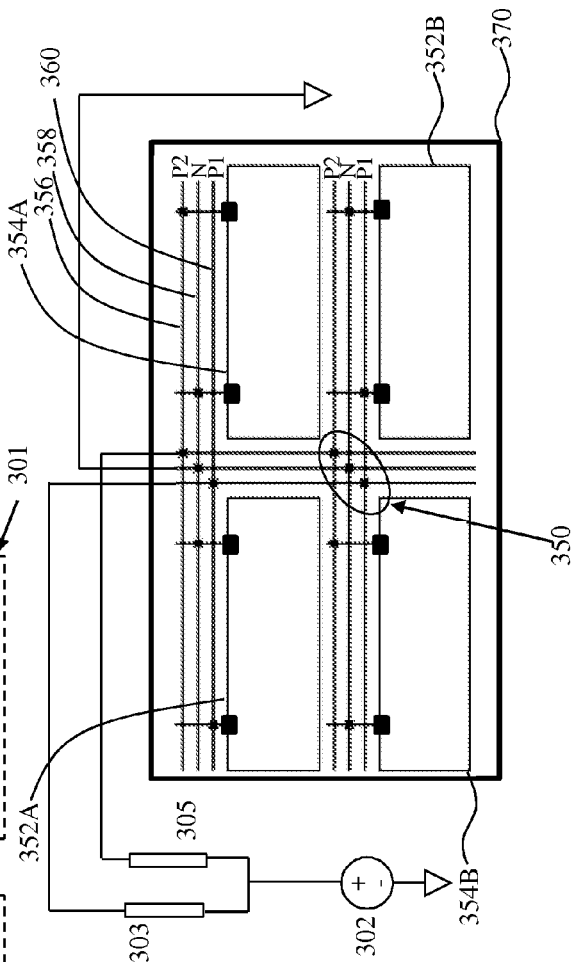
FIG. 13 depicts a top plan view of magnetoresistive devices for differential measurements including a voltage source and matching of the magnetoresistive devices and designed to detect perpendicular magnetic field lines.

FIGS. 12-13 depict differential measurement techniques involving voltage sources. Referring to FIG. 12, a pair of magnetoresistive devices 300 and 301 is shown. Wells or diffusion areas 318 and 319 are positioned within a substrate 320. Each of the two magnetoresistive devices 300 and 301 has a corresponding well 318 and 319 (as indicated by the dashed boxes). The extension of the wells 318 and 319 into the substrate 320 can be minimal. Four ohmic contacts 304, 307, 306, and 308 are used to connect the pair of magnetoresistive devices 300 and 301. The position of these contacts with respect to the wells 318 and 319 are asymmetrical. That is, all four contacts are at the top edge 310 of the wells 318 and 319. The ohmic contacts 304, 307, 306, and 308 could have been placed asymmetrically on other edges of the wells 318 and 319, e.g., bottom edge 311. It is also envisioned that the ohmic contacts 304, 307, 306, and 308 can be placed on different edges. For example, in one embodiment, the ohmic contact 304 and 306 can be placed on the left edge 313 while the ohmic contacts 307 and 308 can be placed on the top edge 310 of the wells 318 and 319, respectively. The ohmic contacts 306 and 307 are coupled to sense resistors 303 and 305, respectively. The ohmic contacts 304 and 308 are coupled to electrical ground. Sense resistors 303 and 305 are connected to the voltage source 302.

Connections between the ohmic contact 306 and the sense resistor 303, the ohmic contact 308 and the sense resistor 305, and the ohmic contacts 304 and 307 and the electrical ground establish curved mean current paths 314 and 316 which run in opposite directions. The curved mean current paths 314 and 316 shown in FIG. 12 are mainly on the upper portion of the well 318 and do not significantly extend into the well 318. Placing the pair of magnetoresistive device 300 and 301 in a magnetic field with magnetic lines perpendicular to the plane of the well 318 results in lengthening or shortening of the mean current paths 314 and 316, depending on the direction of the magnetic field lines. The change in the mean current paths 314 and 316 is such that while one lengthens the other shortens.

The two sense resistors 303 and 305 are provided for measuring the current going through magnetoresistive devices 300 and 301. By measuring the voltage drop across the sense resistors 303 and 305 and dividing the voltage drops by the resistances of the sense resistors 303 and 305, the currents through the corresponding magnetoresistive device can be ascertained.

To measure the intensity of the magnetic field, a differential current $dI_{11-12}$ can be measured with respect to the ohmic contacts 306 and 308. The differential measurement scheme, described below, splits the magnetoresistive devices into two magnetoresistive devices 300 and 301. Offsets present in both of these halves will be cancelled out via the differential measurements. In particular, $I_{11}$ is the current flowing through the ohmic contact 306 which constitutes the current flowing through the first magnetoresistive device 300. $I_{11}$ is measured by dividing the voltage drop across the sense resistor 303 by the resistance of the sense resistor 303. Similarly, $I_{12}$ is the current flowing through the ohmic contact 307 which constitutes the current flowing through the second magnetoresistive device 301. $I_{12}$ is measured by dividing the voltage drop across the sense resistor 305 by the resistance of the sense resistor 305. $dI_{11-12}$ is the current flowing through the ohmic contact 306 minus current flowing through the ohmic contact 307, i.e., $I_{11}-I_{12}$. Once the differential current $dI_{11-12}$ is measured, the bias voltage 302 is reversed and the differential current measurement repeated to produce $dI_{21-22}$, i.e., $I_{21}-I_{22}$. The sum of $dI_{11-12}$ and $dI_{21-22}$ is proportional to the intensity of the magnetic field. While the differential measurement scheme is more complex than the single ended scheme, it improves inaccuracies associated with offsets that can be present in the single ended measurement schemes.

Furthermore, while the differential scheme is an improvement over the single ended measurement scheme, further improvement can be achieved by matching the pair of magnetoresistive devices used in the differential scheme. Referring to FIG. 13, one embodiment of matching a pair of magnetoresistive devices 352 and 354 is shown. Each member of the pair, i.e., 352 and 354, is split into two halves, i.e., 352A, 352B, 354A, and 354B. The sets of halves are oriented about the substrate 370 such that a centroid 350 is formed. A voltage source 302 applies a current to a path 360, which is coupled to the halves 352A and 352B, and a current to a path 356, which is coupled to the halves 354A and 354B. The electrical ground is coupled to a path 358. Two sense resistors 303 and 305 are provided for measuring the current going through each magnetoresistive device. By measuring the voltage drop across the sense resistors 303 and 305, the currents through the corresponding magnetoresistive device can be ascertained. A differential measurement is performed as is described below. $I_{11}$ represents the current flowing through the halves 352A and 352B. $I_{12}$ represents the current flowing through the halves 354A and 354B. The first differential current, i.e., $dI_{11-12}$ is the difference between $I_{11}$ and $I_{12}$, i.e., $I_{11}-I_{12}$. Once the differential current $dI_{11-12}$ is measured, the bias voltage 302 is reversed and the differential current measurement repeated to produce $dI_{21-22}$, i.e., $I_{21}-I_{22}$. The sum of $dI_{11-12}$ and $dI_{21-22}$ is proportional to the intensity of the magnetic field.

Figure 14:
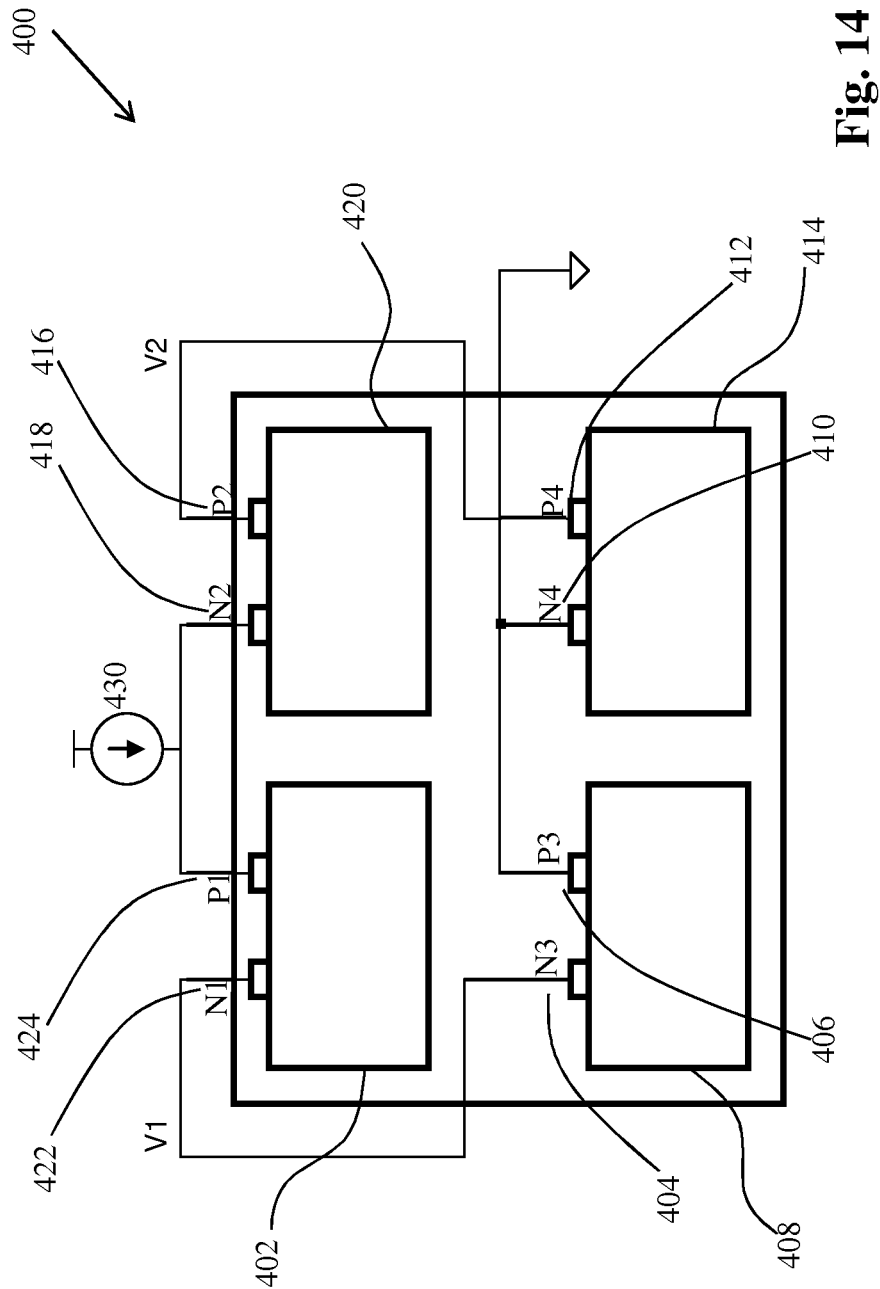
FIG. 14 depicts a top plan view of magnetoresistive devices in a full bridge designed to detect perpendicular magnetic field lines.

Measurement accuracy can further be improved by differentially measuring the mean current paths in magnetoresistive devices placed in a full bridge. Referring to FIG. 14, four magnetoresistive devices 402, 408, 414, and 420 are placed in a bridge 400. A person skilled in the art appreciates that the depicted bridge connection is only for schematic purposes and does not convey physical lay-out characteristics of the devices. The devices can have the same orientation as that depicted in FIGS. 11 and 13, however, the connections depicted in FIG. 14 are configured to form a full bridge. A current source 430 is connected to the magnetoresistive devices 402 and 420 at the ohmic contacts 424 and 418, respectively. Ohmic contacts 422 and 416 of the magnetoresistive devices 402 and 420 are coupled to ohmic contacts 404 and 412 of the magnetoresistive devices 408 and 414, respectively. Ohmic Contacts 406 and 410 of the magnetoresistive devices 408 and 414 are coupled to the electrical ground. A current path develops between each pair of contacts located on a corresponding magnetoresistive device (current paths are not shown). A differential voltage $dV_{11-12}$ is measured between ohmic contacts 422 and 416. This differential voltage includes the desired components that can lead to an accurate measurement of the intensity of the magnetic field as well as undesired components which are due to mismatches between the magnetoresistive devices. To cancel out the undesired components, the current source 430 is reversed and the differential voltage is measured again, i.e., $dV_{21-22}$. Summing the two differential voltages removes the undesired components of the magnetoresistive devices (due to mismatch). Therefore, the sum of these differential voltages is proportional to the intensity of the magnetic field.

The forgoing embodiments relate to measuring magnetic field intensity in the presence of a field that is perpendicular to the plane of the well or diffusion area. For these embodiments, the depth of the well is not critical. For magnetic fields that are parallel to the plane, a different structure is utilized. Referring to FIG. 15, in reference to one embodiment, a top plan view of a magnetoresistive device 500 for in-plane magnetic fields is shown. The magnetoresistive device 500 has a substrate 502 with a well or diffusion area 504. The substrate can be a positively or a negatively doped substrate. The well 504 can be an N-well, a P-well, an N-diffusion, or a P-diffusion area. The well 504, however, is of an opposite doping type than the substrate 502.

Ohmic contacts 506 and 508 are also placed over the well 504. Ohmic contacts 506 and 508 run the width of the well

504. A current source 522 is connected to the ohmic contact 506 while the ohmic contact 508 is connected to the electrical ground.

The connections between the ohmic contact 506 and the current source 522 and the ohmic contact 508 and electrical ground establish a mean current path 520 (shown in FIG. 16). The curved mean current path 520 is depicted in the absence of a magnetic field. Referring to FIG. 16, a cross-sectional view of the magnetoresistive device for in-plane magnetic field measurements is shown. As shown in FIG. 16, the curved mean current path 520 extends into the well 504. In the embodiments of FIGS. 15-16 no magnetic field is present. Referring to FIG. 17, an in-plane magnetic field having lines 524 is shown. Some of the lines 524 are shown in solid lines indicating these lines are at the top surface of the well 504. Some of the lines 524 are shown in dashed lines indicating these lines are below the surface of the well 504. The in-plane magnetic field causes the curved mean current path 520 to further dip into the well 504 producing deep mean current path 526. In FIG. 18, the deep mean current path 526 is shown as a solid curved path while the curved mean current path 520, referring to the mean current path with zero magnetic field, is shown as a phantom mean current path. If the in-plane magnetic field direction is in an opposite direction as compared to the magnetic field shown in FIG. 17, then the curved mean current path would be shallower than the curved mean current path 520. This combination is shown in FIGS. 19 and 20. In FIG. 19, the in-plane magnetic field having lines 528 causes the curved mean current path 520 to become a shallow mean current path 530 (shown in FIG. 20). In FIG. 20, the shallow mean current path 530 is shown as a solid curved path while curved mean current path 520, referring to the mean current path with zero magnetic field, is shown as a phantom mean current path. Reversing the current source 522 has a similar effect as reversing the in-plane magnetic field direction, which is depicted in FIG. 21. The reversed current source 532 causes the shallow mean current path to become the deep mean current path 534.

The embodiments described above with respect to measuring magnetic fields that are perpendicular to the plane of the well or diffusion area are also applicable to the in-plane magnetic field embodiment. In particular, embodiments dealing with measuring magnetic fields that are perpendicular to the plane of the well or diffusion area using current-based single ended measurements, voltage-based single ended measurements, current-based differential measurements (including the common centroid embodiment for improved accuracy), voltage-based differential measurements (including the common centroid embodiment for improved accuracy), and differential measurement across a full bridge can also be used for the in-plane magnetic fields.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

We claim:

1. A magnetic field measuring system comprising:
    a substrate of a first conductivity type;
    a conductive well of a second conductivity type formed in the substrate, the second conductivity type being different than the first conductivity type, the well having a first side with a first length that defines a length of the well and a second side with a second length that defines a width of the well, the second length being less than the first length;
    a first contact electrically connected to the conductive well at a first location along the first side;
    a second contact electrically connected to the conductive well at a second location along the first side, wherein the first contact and the second contact are electrically coupled to each other via the conductive well, and wherein the distance between the first location and the second location is less than the second length;
    a stimulus circuit coupled to the first contact and the second contact; and
    a sensor for identifying a property indicative of the length of a current path from the first location to the second location through the conductive well.

2. The system of claim 1, wherein:
    the sensor comprises a current sensor for measuring the amount of current flowing through the current path; and
    the stimulus circuit comprises a voltage source coupled to the first and the second contacts.

3. The system of claim 1, wherein:
    the sensor comprises a voltage sensor for measuring a voltage difference between the first contact and the second contact; and
    the stimulus circuit comprises a current source coupled to the first and the second contacts.

4. The system of claim 1, wherein the conductive well comprises four doped regions, each of the four doped regions separated from the other of the four doped regions to form a centroid.

5. The system of claim 1, wherein the conductive well is centrally located within the substrate.

6. The system of claim 1, further comprising:
    a memory in which command instructions are stored; and
    a processor configured to execute the command instructions to
        (i) apply a first bias voltage across the first contact and the second contact,
        (ii) obtain a first signal indicative of the current flowing through the conductive well between the first contact and the second contact with the first bias voltage applied,
        (iii) apply a second bias voltage across the first contact and the second contact,
        (iv) obtain a second signal indicative of the current flowing through the conductive well between the first contact and the second contact with the second bias voltage applied, and
        (v) generate a signal indicative of the strength of a magnetic field intersecting the conductive well based upon the first signal and the second signal.

7. The system of claim 6, the processor further configured to execute the command instructions to generate a signal indicative of the direction of the magnetic field intersecting the conductive well based upon the first signal and the second signal.

8. The system of claim 1, further comprising:
    a memory in which command instructions are stored; and
    a processor configured to execute the command instructions to
        (i) apply a first current through the first contact and the second contact,
        (ii) obtain a first signal indicative of the voltage difference between the first contact and the second contact with the first current applied, (iii) apply a second current through the first contact and the second contact, (iv) obtain a second signal indicative of the voltage difference between the first contact and the second contact with the second current applied, and (v) generate a signal indicative of the strength of a magnetic field intersecting the conductive well based upon the first signal and the second signal.

9. The system of claim 8, the processor further configured to execute the command instructions to generate a signal indicative of the direction of the magnetic field intersecting the conductive well based upon the first signal and the second signal.

10. A method of measuring a magnetic field comprising:

forming a conductive well of a first conductivity type in a substrate of a second conductivity type, the second conductivity type being different than the first conductivity type, the well having a first edge with a first length that defines a length of the well and a second edge with a second length that defines a width of the well, the second edge being less than the first edge;

electrically coupling a first contact to the conductive well at a first location of the first edge;

electrically coupling a second contact to the conductive well at a second location of the first edge, wherein the distance between the first location and the second location is less than the second length;

identifying a property indicative of the length of a current path from the first location to the second location through the conductive well; and determining the strength of a magnetic field passing through the conductive well based upon the identified property.

11. The method of claim 10, further comprising:

applying a first bias voltage across the first contact and the second contact;

obtaining a first signal indicative of the current flowing through the conductive well between the first contact and the second contact with the first bias voltage applied;

applying a second bias voltage across the first contact and the second contact;

obtaining a second signal indicative of the current flowing through the conductive well between the first contact and the second contact with the second bias voltage applied; and generating a signal indicative of the strength of the magnetic field intersecting the conductive well based upon the first signal and the second signal.

12. The method of claim 11, further comprising:

generating a signal indicative of the direction of the magnetic field intersecting the conductive well based upon the first signal and the second signal.

13. The method of claim 11, wherein the first bias voltage has a polarity that is opposite to a polarity of the second bias voltage.

14. The method of claim 10, further comprising:

applying a first current through the first contact and the second contact;

obtaining a first signal indicative of the voltage difference between the first contact and the second contact with the first current applied;

applying a second current through the first contact and the second contact;

obtaining a second signal indicative of the voltage difference between the first contact and the second contact with the second current applied; and generating a signal indicative of the strength of a magnetic field intersecting the conductive well based upon the first signal and the second signal.

15. The method of claim 14, further comprising:

generating a signal indicative of the direction of the magnetic field intersecting the conductive well based upon the first signal and the second signal.

16. The method of claim 14, wherein:

the first current is applied to pass from the first contact through the conductive well to the second contact; and the second current is applied to pass from the second contact through the conductive well to the first contact.

* * * * *